(12) United States Patent
Sugita et al.

(10) Patent No.: US 10,948,317 B2
(45) Date of Patent: Mar. 16, 2021

(54) MEASURING DEVICE AND METHOD FOR OBTAINING AMOUNT OF DEVIATION OF MEASURING DEVICE

(71) Applicant: TOKYO ELECTRON LIMITED, Tokyo (JP)

(72) Inventors: Kippei Sugita, Miyagi (JP); Daisuke Kawano, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 196 days.

(21) Appl. No.: 16/294,385

(22) Filed: Mar. 6, 2019

(65) Prior Publication Data

US 2019/0277665 A1  Sep. 12, 2019

(30) Foreign Application Priority Data

Mar. 9, 2018  (JP) .............................. JP2018-042967

(51) Int. Cl.
| | |
|---|---|
| *G01R 27/26* | (2006.01) |
| *G01D 5/24* | (2006.01) |
| *H01L 21/67* | (2006.01) |
| *H01L 21/68* | (2006.01) |

(52) U.S. Cl.
CPC ..... *G01D 5/2405* (2013.01); *H01L 21/67259* (2013.01); *H01L 21/68* (2013.01)

(58) Field of Classification Search
CPC .... G01R 27/2605; G01R 27/26; H02M 3/156
See application file for complete search history.

(56) References Cited

U.S. PATENT DOCUMENTS

| | | | | |
|---|---|---|---|---|
| 9,841,395 | B2 * | 12/2017 | Sugita | ............... G01R 27/2605 |
| 10,074,549 | B2 * | 9/2018 | Sugita | ............... H01L 21/67748 |
| 2010/0141275 | A1 * | 6/2010 | Matsushima | ........... G06F 3/044 |
| | | | | 324/678 |
| 2016/0363433 | A1 | 12/2016 | Sugita et al. | |
| 2016/0363556 | A1 * | 12/2016 | Sugita | ............... G01R 27/2605 |

FOREIGN PATENT DOCUMENTS

JP  2017-003557 A  1/2017

* cited by examiner

*Primary Examiner* — Alesa Allgood
(74) *Attorney, Agent, or Firm* — Rothwell, Figg, Ernst & Manbeck, P.C.

(57) ABSTRACT

A measuring device includes a disc-shaped base substrate, sensor electrodes arranged circumferentially along a periphery of the base substrate, a high frequency oscillator configured to apply a high frequency signal to the sensor electrodes, C/V conversion circuits, each being configured to convert a voltage amplitude at a corresponding sensor electrode among the sensor electrodes to a voltage signal indicating an electrostatic capacitance, an A/D converter configured to convert the voltage signal outputted from each of the C/V conversion circuits to a digital value, and a switching mechanism configured to switch each sensor electrode of the sensor electrodes between a first state in which the sensor electrodes are electrically connected to the C/V conversion circuits and a second state in which electrode pairs are connected to different C/V conversion circuits among the C/V conversion circuits. Each electrode pair includes circumferentially adjacent two sensor electrodes among the sensor electrodes.

11 Claims, 11 Drawing Sheets

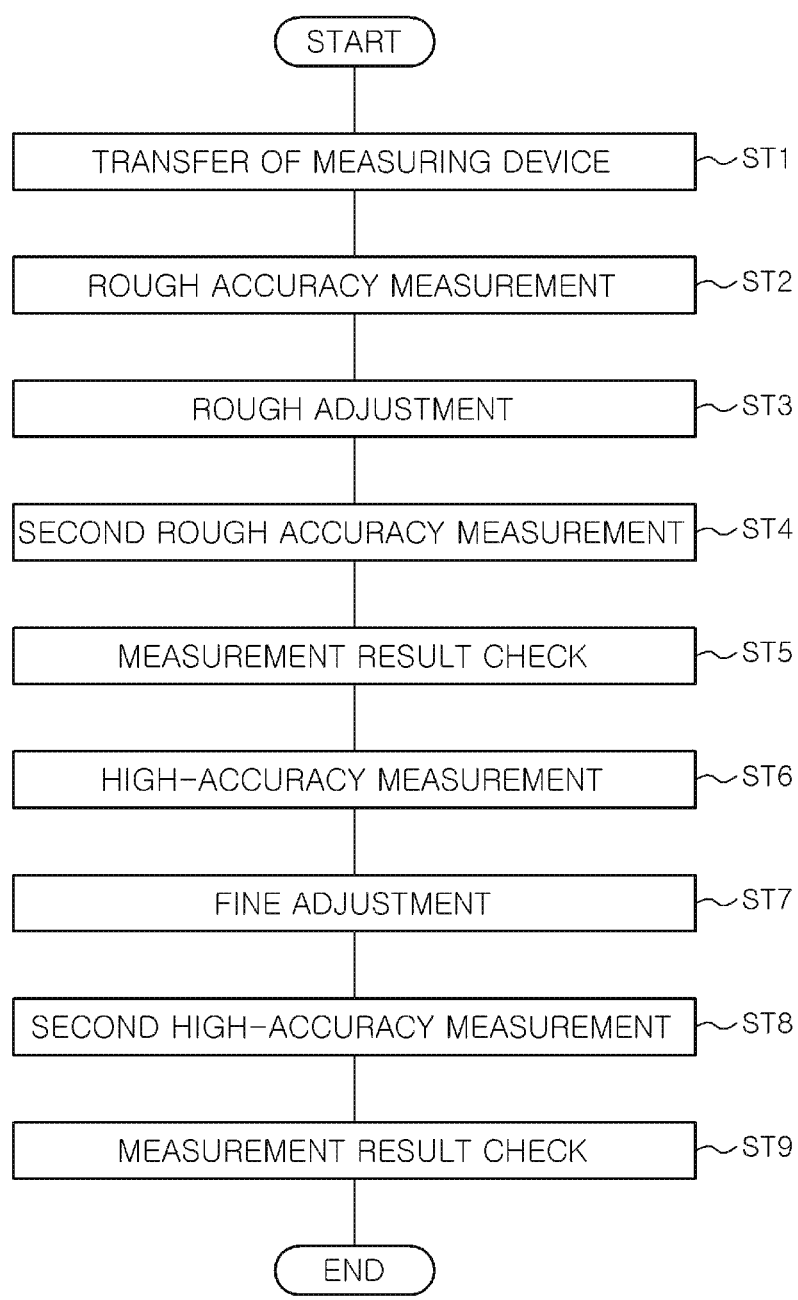

MEASURING DEVICE AND METHOD FOR OBTAINING AMOUNT OF DEVIATION OF MEASURING DEVICE

CROSS-REFERENCE TO RELATED APPLICATIONS

This application claims priority to Japanese Patent Application No. 2018-042967 filed on Mar. 9, 2018, the entire contents of which are incorporated herein reference.

TECHNICAL FIELD

The present disclosure relates to a measuring device and a method for obtaining the amount of deviation of the measuring device.

BACKGROUND

In manufacturing electronic devices such as semiconductor devices, a processing system for processing a disc-shaped target object is used. The processing system includes a transfer unit for transferring the target object and a processing unit for processing the target object. Generally, the processing unit includes a chamber body and a mounting table provided is the chamber body. The mounting table is configured to support the target object mounted thereon. The transfer unit is configured to transfer the target object onto the mounting table.

When the target object is processed by the processing unit, a position of the target object on the mounting table is important. Therefore, when the position of the target object on the mounting table is deviated from a predetermined position, it is required to adjust the transfer unit.

As for a technique for adjusting the transfer unit, there is known a technique described in Japanese Patent Application Publication No. 2017-3557. In the technique described in Japanese Patent Application. Publication No. 2017-3557, a measuring device that is formed in the same disc shape as that of the target object and has an electrode for capacitance measurement is used. In the technique described in Japanese Patent Application Publication No. 2017-3557, the measuring device is transferred onto the mounting table by the transfer unit. The electrostatic capacitance that is dependent on the position of the electrode on the mounting table measured, and the transfer unit is adjusted to correct the transfer position of the target object based on the measurement value.

The above-described measuring device obtains the measurement value of the electrostatic capacitance between the electrode and the target object facing the electrode. The electrostatic capacitance is in inverse proportion to the distance between the electrode and the target object. Therefore, as the distance between the electrode and the target object is increased, the acquired measurement value is decreased and the sensitivity is decreased. The area of the electrode may be increased to suppress the decrease in the sensitivity. However, if the area of the electrode is excessively increased, the measurement value is excessively increased when the distance between the electrode and toe target object is small, which makes appropriate measurement impossible. Therefore, it is required to appropriately obtain the measurement value of the electrostatic capacitance without depending on the distance between the electrode and the target object.

SUMMARY

In accordance with an aspect, there is provided a measuring device comprising a disc-shaped base substrate, a plurality of sensor electrodes, a high frequency oscillator, a plurality of C/V conversion circuits, an A/D converter, and a switching mechanism. The plurality of sensor electrodes is arranged in a circumferential direction along a periphery of the base substrate. The high frequency oscillator is configured to apply a high frequency signal to the sensor electrodes. Each of the C/V conversion circuits is configured to convert a voltage amplitude at a corresponding sensor electrode among the plurality of sensor electrodes to a voltage signal indicating an electrostatic capacitance. The A/D converter is configured to convert the voltage signal outputted from each of the C/V conversion circuits to a digital value. The switching mechanism is configured to switch each sensor electrode of the plurality of sensor electrodes between a first state in which the sensor electrodes are electrically connected to the conversion circuits and a second state in which a plurality of electrode pairs are connected to different C/V conversion circuits among the C/V conversion circuits. Each electrode pair includes two sensor electrodes adjacent in the circumferential direction among the sensor electrodes.

In accordance with an aspect, there is provided a method for obtaining the amount of deviation of the above-described measuring device that is transferred by a transfer unit. The transfer unit transfers a target object into a region surrounded by a focus ring based on transfer position data. The amount of deviation is the amount of deviation of a central position of the measuring device disposed in the region with respect to a central position of the region. The method comprises: transferring the measuring device to a position in the region specified by the transfer position data by using the transfer unit; calculating, as a plurality of first measurement values, a plurality of digital values including the digital values obtained from the voltage signals outputted from the C/V conversion circuits in the first state; adjusting a position of the measuring device by using calibrated transfer position data obtained by calibrating the transfer position data based on the amount of deviation of a central position of the measuring device with respect to a central position of the area that is obtained from the first measurement values; deriving the amount of deviation of the central position of the measuring device with respect to the central position of the region from a plurality of second measurement values after the position of the measuring device is adjusted, wherein the second measurement values are a plurality of digital values including the digital values obtained from the voltage signals outputted from the different C/V conversion circuits in the second state.

BRIEF DESCRIPTION OF THE DRAWINGS

The objects and features of the present disclosure will become apparent from the following description of embodiments, given in conjunction with the accompanying drawings, in which:

FIG. 11 is a flowchart showing one embodiment of a method for obtaining the amount of deviation by using the measuring device.

DETAILED DESCRIPTION

Figure 1:
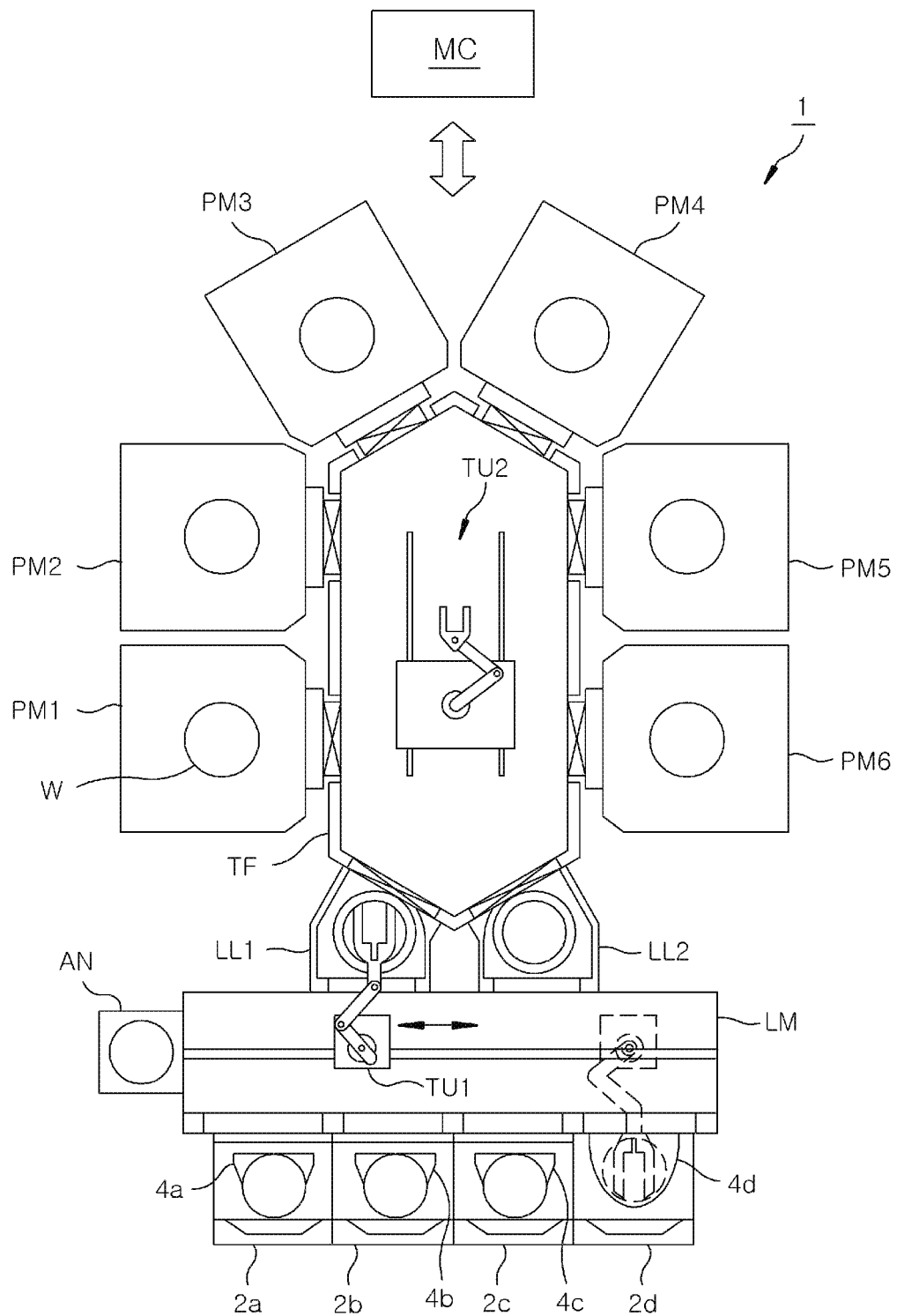
FIG. 1 shows an example of a processing system.

Hereinafter, embodiments will be described in detail with reference to the accompanying drawings. Like reference numerals will be given to like corresponding parts throughout the drawings.

FIG. 1 shows an example of the processing system. The processing system 1 includes stages 2a to 2d, containers 4a to 4d, a loader module EM, an aligner AN, load-lock modules LL1 and LL2, process modules PM1 to PM6, a transfer module TF, and a control unit MC. The number of the stages 2a to 2d, the number of the containers 4a to 4d, the number of the load-lock modules LL1 and LL2, and the number of the process modules PM1 to PM6 are not limited and may be one or more.

The stages 2a to 2d are arranged along one side of the loader module LM. The containers 4a to 4d are mounted on the stages 2a to 2d, respectively. Each of the containers 4a to 4d is, e.g., a container referred to as a FOUP (Front Opening Unified Pod). Each of the containers 4a to 4d is configured to accommodate target objects W. The target objects N have substantially disc shapes similar to that of a wafer.

The loader module LM has a chamber wall that defines an atmospheric transfer space therein. A transfer unit TU1 is provided in this transfer space. The transfer unit. TU1 is, e.g., a multi-joint robot, and is controlled by the control unit MC. The transfer unit TU1 is configured to transfer the target object N between the containers 4a to 4d and the aligner AN, between the aligner AN and the load-lock modules LL1 to LL2, and between the load-lock modules LL1 to LL2 and the containers 4a to 4d.

Figure 2:
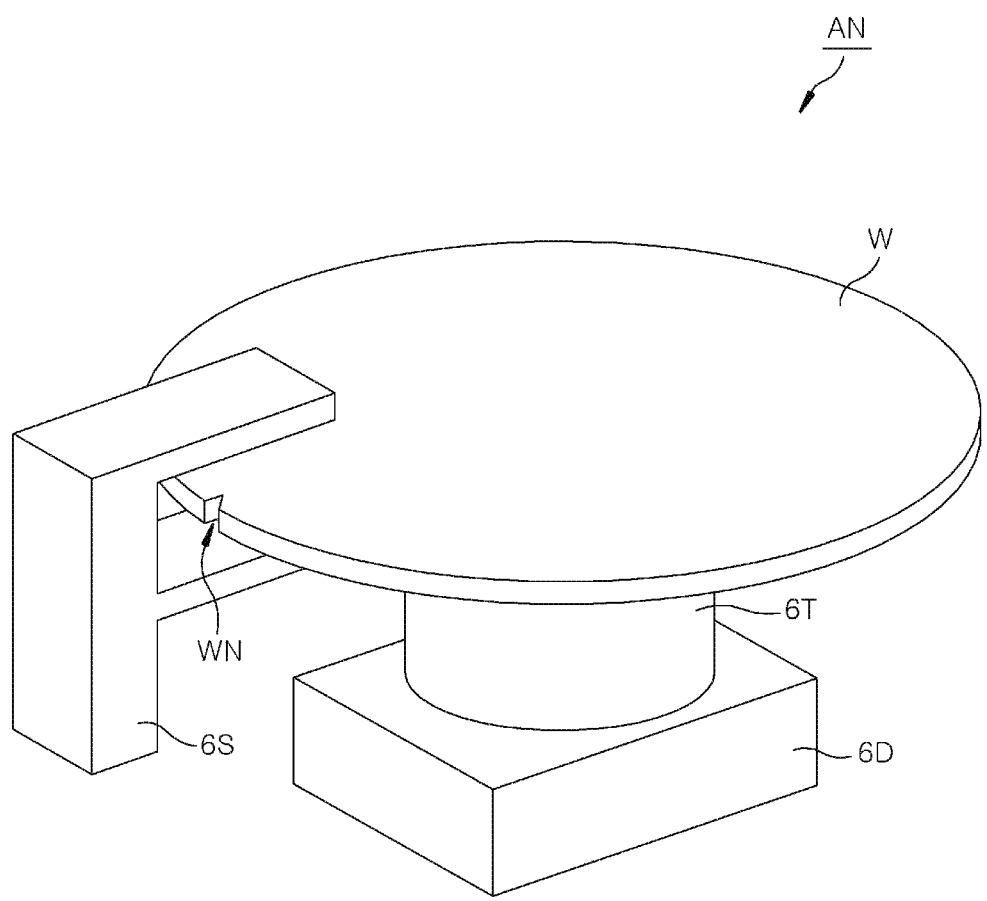
FIG. 2 is a perspective view showing an example of an aligner.

The aligner AN is connected to the loader module LM. The aligner AN is configured to adjust (calibrate) the position of the target object W. FIG. 2 is a perspective view showing an example of the aligner. The aligner AN includes a supporting table 6T, a driving unit 6D, and a sensor 6S. The supporting table 6T is a table that is rotatable about an axis extending in a vertical direction, and is configured to support the target object W thereon. The supporting table 6T is rotated by the driving unit 6D. The driving unit 6D is controlled by the control unit MC. When the supporting table 6T is rotated by power from the driving unite 6D, the target object W mounted on the supporting table 6T is also rotated.

The sensor 6S is an optical sensor, and detects an edge of the target object W during the rotation of the target object W. The sensor 6S detects the amount of deviation of an angular position of a notch WN (or another marker) of the target object W from a reference angular position and the amount of deviation of a central position of the target object W from the reference position based on the edge detection result. The sensor 6S outputs the amount of deviation of the angular position of the notch WN and the amount of deviation of the central position of the target object W to the control unit MC. The control unit MC calculates the amount of rotation of the supporting table 6T which will be used for correcting the angular position of the notch WN to the reference angular position based on the amount of deviation of the angular position of the notch WN. The control unit MC controls the driving unit 6D to rotate the supporting table 6T by the amount of rotation. Accordingly, the angular position of the notch WN can be corrected to the reference angular position. Further, the control unit MC controls a position of an end effector of the transfer unit TU1 at the time of receiving the target object W from the aligner AN based on the amount of deviation of the central position of the target object W such that the central position of the target object W coincides with a predetermined position on the end effector of the transfer unit TU1.

Referring back to FIG. 1, each of the load-lock modules LL1 and LL2 is provided between the loader module LM and the transfer module TF. Each of the load-lock modules LL1 and LL2 provides a preliminary decompression chamber.

The transfer module TF is connected to the load-lock modules LL1 and LL2 through gate valves. The transfer module TF provides a decompressurizable decompression chamber. A transfer unit TU2 is provided in this decompression chamber. The transfer unit TU2 is, e.g., a multi-joint robot, and is controlled by the control unit MC. The transfer unit TU2 is configured to transfer the target object N between the load-lock modules LL1 and LL2 and the process modules PM1 to PM6 and between any two process modules among the process modules PM1 to PM6.

The process modules PM1 to PM6 are connected to the transfer module TF through gate valves. Each of the process modules PM1 to PM6 is a processing apparatus configured to perform a dedicated process, such as plasma processing, on the target object W.

The following is description on a series of operations at the time of processing the target object N in the processing system 1. The target object W is unloaded from any one of the containers 4a to 4d and transferred to the aligner AN by the transfer unit TU1 of the loader module LM. Next, the transfer unit. TU1 transfers the aligned target object W from the aligner AN to one of the load-lock modules LL1 and LL2. Then, a pressure in a preliminary decompression chamber of the load-lock module LL1 or LL2 is decreased to a predetermined level. Thereafter, the target object W is transferred from the load-lock module LL1 or LL2 to one of the process modules PM1 to PM6 by the transfer unit TU2 of the transfer module TF. The target object N is processed in one or more process modules among the process modules PM1 to PM6. Next, the processed target object N is transferred from the process module to one of the load-lock modules LL1 and LL2 by the transfer unit TU2. Then, the target object W is transferred from the load-lock module LL1 or LL2 to one of the containers 4a to 4d by the transfer unit TU1.

As described above, the processing system 1 includes the control unit MC. The control unit MC may be a computer including a processor, a storage unit such as a memory, a display unit, an input/output unit, a communication unit, and the like. The above-described series of operations of the processing system 1 are realized by controlling the respective components of the processing system 1 by the control unit MC based on a program stored in the storage unit.

Figure 3:
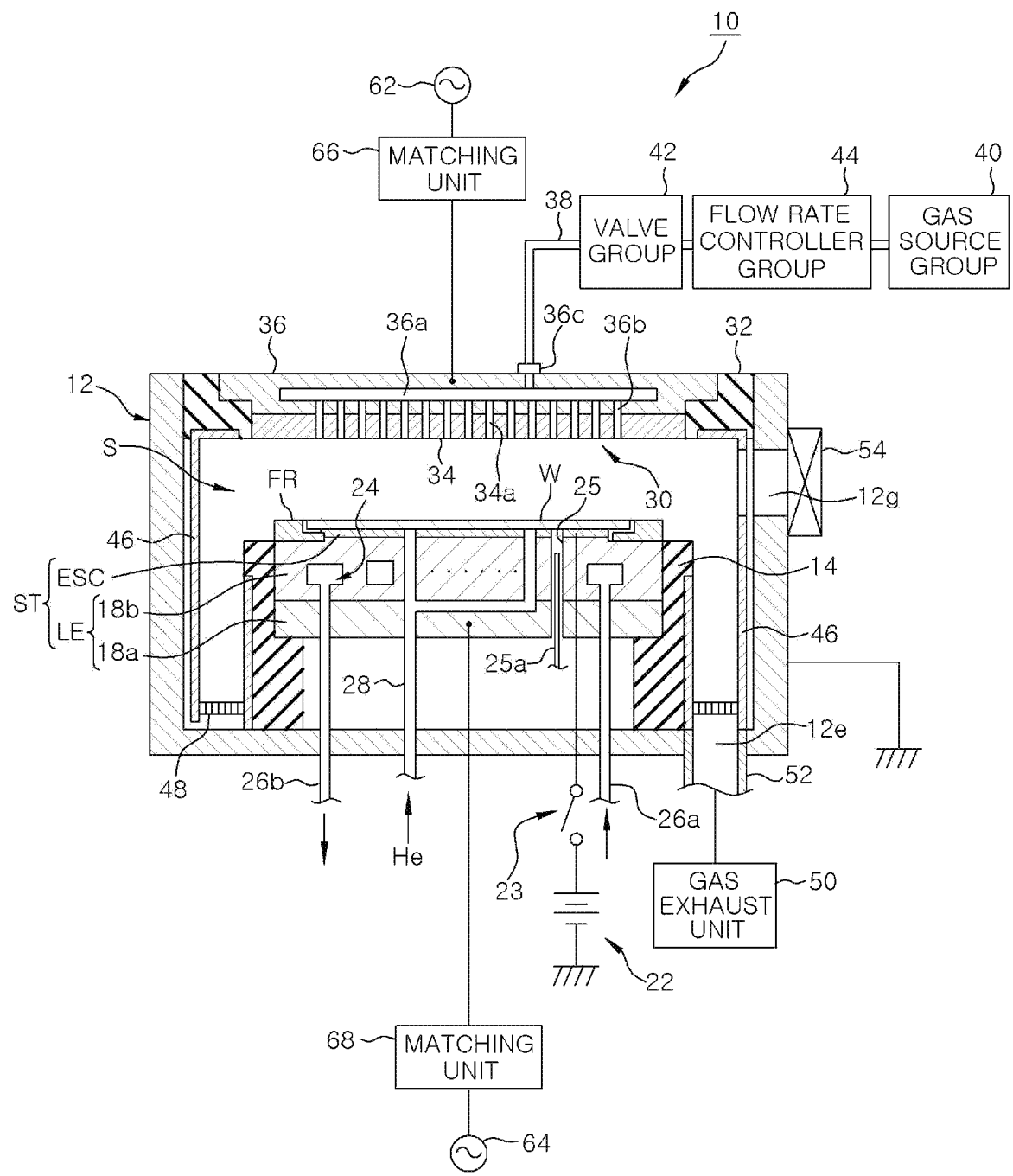
FIG. 3 shows an example of a plasma processing apparatus.

FIG. 3 shows an example of a plasma processing apparatus that may be employed as one of the process modules PM1 to PM6. The plasma processing apparatus 10 shown in FIG. 3 is a capacitively coupled plasma etching apparatus. The plasma processing apparatus 10 includes a substantially cylindrical chamber body 12. The chamber body 12 is made of, e.g., aluminum. Anodic oxidation treatment may be performed on an inner wall surface of the chamber body 12. The chamber body 12 is frame grounded.

A substantially cylindrical supporting member 14 is provided on a bottom portion of the chamber body 12. The supporting member 14 is made of, e.g. an insulating material. The supporting member 14 is provided in the chamber body 12 and extends upward from the bottom portion of the chamber body 12. A stage ST is provided in a chamber S defined by the chamber body 12 and supported by the supporting member 14.

The stage ST includes a lower electrode LE and an electrostatic chuck ESC. The lower electrode LE has a first plate 18a and a second plate 18b. The first plate 18a and the second plate 18b are made of a metal, e.g., aluminum, and have a substantially disc shape. The second plate 18b is provided on the first plate 18a. The second plate 18b is electrically connected to the first plate 18a.

The electrostatic chuck ESC is provided on the second plate 18b. The electrostatic chuck ESC has a structure in which an electrode that is a conductive film is interposed between two insulating layers or sheets. The electrostatic chuck ESC has a substantially disc shape. A DC power supply is electrically connected to the electrode of the electrostatic chuck ESC via a switch 23. The target object W is attracted and held on the electrostatic chuck ESC by electrostatic force such as Coulomb force or the like which is generated by a DC voltage from the DC power supply 22. Accordingly, the target object W can be held on the electrostatic chuck ESC.

A focus ring FR is provided on a peripheral portion of the second plate 18b. The focus ring FR surrounds an edge of the target object W and the electrostatic chuck ESC. The focus ring FR has a first portion P1 and a second portion P2 (see FIG. 6). The first portion P1 and the second portion P2 have an annular plate shape. The second portion P2 is disposed on the first portion P1. A diameter of an inner periphery P2i of the second portion P2 is greater than a diameter of an inner periphery P1i of the first portion P1. The target object W is mounted on the electrostatic chuck ESC such that the edge region thereof is positioned above the first portion P1 of the focus ring FR. The focus ring FR may be made of a material selected among silicon, silicon carbide, silicon oxide, and the like.

A coolant channel 24 is provided in the second plate 18b. The coolant channel 24 constitutes a temperature control mechanism. A coolant is supplied from a chiller unit (not shown) provided outside the chamber body 12 into the coolant channel 24 through a line 26a. The coolant supplied into the coolant channel 24 is returned to the chiller unit through a Line 26b. The coolant circulates between the coolant channel 24 and the chiller unit. By controlling a temperature of the coolant, a temperature of the target object W held on the electrostatic chuck ESC is controlled.

A plurality of (e.g., three) through-holes 25 is formed through the stage ST. A plurality of (e.g., three) lift pins 25a is inserted into the through-holes 25, respectively. FIG. 3 shows one through-hole 25 into which one lift pin 25a is inserted.

The plasma processing apparatus 10 is provided with a gas supply line 28. The gas supply line 28 supplies a heat transfer gas, e.g., He gas, from a heat transfer gas supply mechanism to a gap between the upper surface of the electrostatic chuck ESC and the backside of the target object W.

The plasma processing apparatus 10 includes an upper electrode 30. The upper electrode 30 is provided above the stage ST to face the stage ST. The upper electrode 30 is supported at an upper portion of the chamber body 12 through an insulating shielding member 32. The upper electrode 30 may include a ceiling plate 34 and a holding body 36. The ceiling plate 34 faces the chamber S, and a plurality of gas injection holes 34a is formed in the ceiling plate 34. The ceiling plate 34 may be made of silicon or quartz. Alternatively, the ceiling plate 34 may be formed by forming a plasma resistant film such as yttrium oxide on a surface of an aluminum base material.

The holding body 36 detachably holds the ceiling plate 34, and may be made of a conductive material, e.g., aluminum. The holding body 36 may have a water-cooling structure. A gas diffusion space 36a is provided inside the holding body 36. A plurality of gas holes 36b communicating with the gas injection holes 34a extends downward from the gas diffusion space 36a. A gas inlet, port 36c for introducing a processing gas into the gas diffusion space 36a is formed at the holding body 36. A gas supply line 38 is connected to the gas inlet port 36c.

A gas source group 40 is connected to the gas supply line 38 through a valve group 42 and a flow rate controller group 44. The gas source group 40 includes a plurality of gas sources for a plurality of gases. The valve group 42 includes a plurality of valves. The flow rate control group 44 includes a plurality of flow rate controllers such as mass flow controllers. The gas sources of the gas source group 40 are connected to the gas supply line 38 via corresponding valves of the valve group 42 and corresponding flow rate controllers of the flow rate control group 44, respectively.

In the plasma processing apparatus 10, a deposition shield 46 is detachably provided along an inner surface of a sidewall of the chamber body 12. The deposition shield 46 is also provided at an outer periphery of the supporting member 14. The deposition shield 46 prevents etching by-products (deposits) from being adhered to the chamber body 12. The deposition shield 46 may be formed by coating ceramic such as yttrium oxide or the like on an aluminum base material.

At a lower portion in the chamber body 12, a gas exhaust plate 48 is provided between the supporting member 14 and the sidewall of the chamber body 12. The gas exhaust plate 48 may be formed by coating ceramic such as yttrium oxide or the like on an aluminum base material, for example. The gas exhaust plate 48 has a plurality of through-holes penetrating therethrough in a plate thickness direction. A gas exhaust port 12e is provided at the chamber body 12 to be positioned below the gas exhaust plate 48. A gas exhaust unit 50 is connected to the gas exhaust port 12e through the gas exhaust line 52. The gas exhaust unit 50 includes a pressure control valve and a vacuum pump such as a turbo molecular pump or the like, and thus can decrease a pressure in the chamber body 12 to a desired vacuum level. A loading/unloading port 12g for the target object W is provided at the sidewall of the chamber body 12. The loading/unloading port 12g can be opened and closed by a gate valve 54.

The plasma processing apparatus 10 further includes a first high frequency power supply 62 and a second high frequency power supply 64. The first high frequency power supply 62 generates a first high frequency power, which has a frequency of, e.g., 27 MHz to 100 MHz, for plasma generation. The first high frequency power supply 62 is connected to the upper electrode 30 via a matching unit 66. The matching unit 66 includes a circuit for matching an output impedance of the high frequency power supply 62 and an input impedance on a load side (the upper electrode 30 side). The first high frequency power supply 62 may be connected to the lower electrode LE via the matching unit 66.

The second high frequency power supply 64 generates a second high frequency power, which has a high frequency of, e.g., 400 kHz to 13.56 MHz, for attracting ions to the target object W. The second high frequency power supply 64 is connected to the lower electrode LE via a matching unit 68. The matching unit 68 includes a circuit for matching an output impedance of the second high frequency power supply 64 and an input impedance of a load side (the lower electrode LE side).

In the plasma processing apparatus 10, a gas from one or more gas sources selected among the gas sources is supplied into the chamber S. A pressure in the chamber S is set to a predetermined pressure by the gas exhaust unit 50. The gas in the chamber S is excited by the first high frequency power from the first high frequency power supply 62 to generate plasma. The target object W is processed by active species. If necessary, ions may be attracted to the target object W by the second high frequency power for bias of the second high frequency power supply 64.

Figure 4:
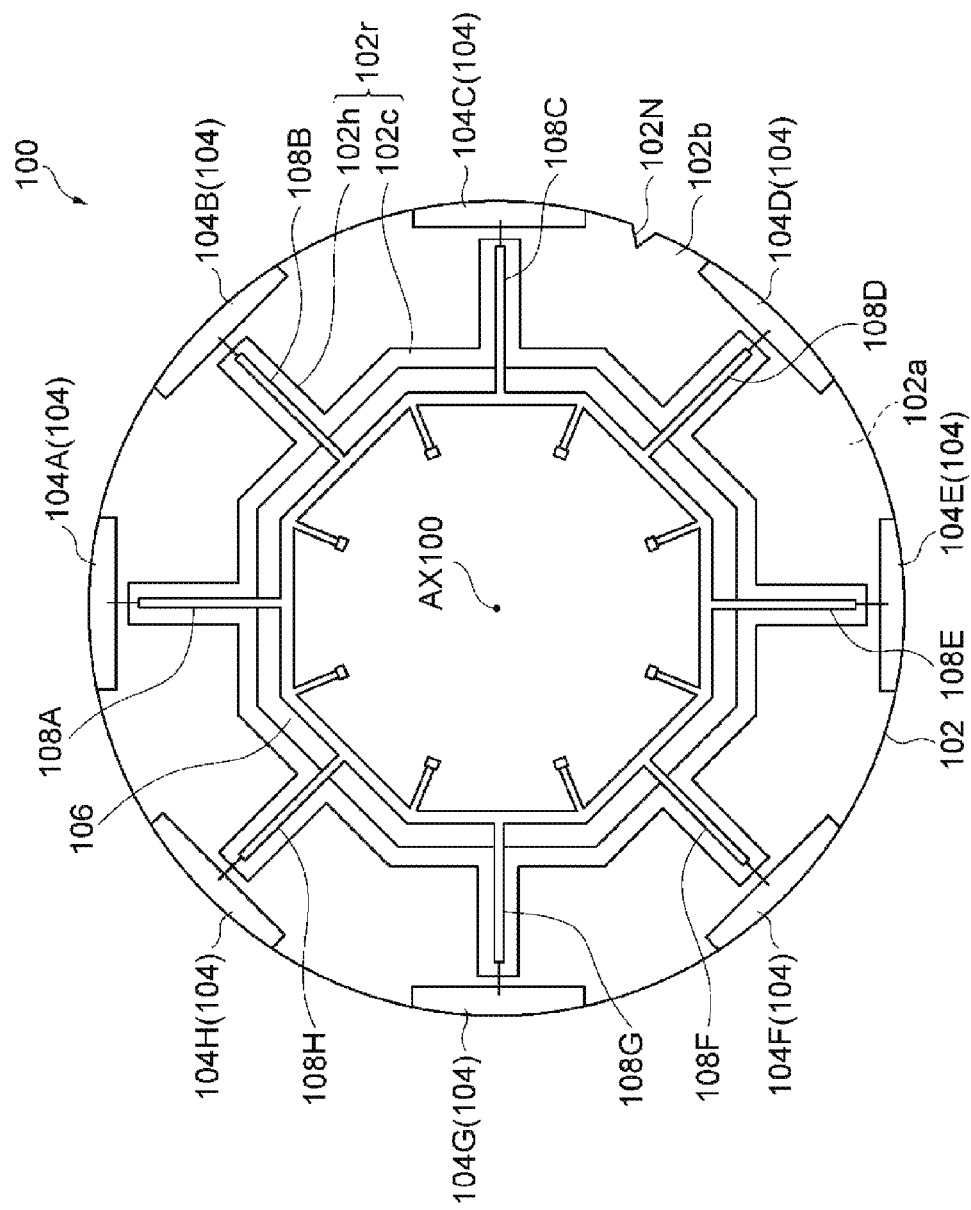
FIG. 4 is a plan view of a measuring device when viewed from the top.

Hereinafter, the measuring device will be described. FIG. 4 is a plan view of the measuring device viewed from the top. A measuring device 100 shown in FIG. 4 includes a lower part 102a, an upper part 102b, and a base substrate 102. The base substrate 102 is made of, e.g., silicon, and formed in the same shape as that of the target object W, i.e., a substantially disc shape. A diameter of the base substrate 102 is the same as that of the target object W, e.g., 300 mm. The shape and the size of the measuring device 100 may be defined by the shape and the size of the base substrate 102. Therefore, the measuring device 100 has the same shape and the same size as those of the target object W. A notch 102N (or another marker) is formed at an edge of the base substrate 102.

A plurality of sensor chips 104A to 104H is provided at the upper part 102b of the base substrate 102. The sensor chips 104A to 104H are arranged at a regular interval along the edge of the base substrate 102 in the entire circumference of the edge. In other words, the sensor chips 104A and 104E are disposed symmetrically with respect to the central axis AX100. The sensor chips 104E and 104F are disposed symmetrically with respect to the central axis AX100. The sensor chips 104C and 104G are disposed symmetrically with respect to the central axis AX100. The sensor chips 104D and 104H are disposed symmetrically with respect to the central axis AX100.

The upper surface of the upper part 102b of the base substrate 102 provides a recess 102r. The recess 102r includes a central region 102c and a plurality of radial regions 102h. The central region 102c intersects with the central axis AX100. The central axis AX100 passes through the center of the base substrate 102 in the thickness direction. A circuit board 106 is provided in the central area 102c. The radial regions 102h extend from the central region 102c in a radial direction with respect to the central axis AX 200 toward the regions where the sensor chips 104A to 104H are disposed. In the radial regions 102h, wiring groups 108A to 108H for electrically connecting the sensor chips 104A to 104H to the circuit board 106 are provided.

Figure 5:
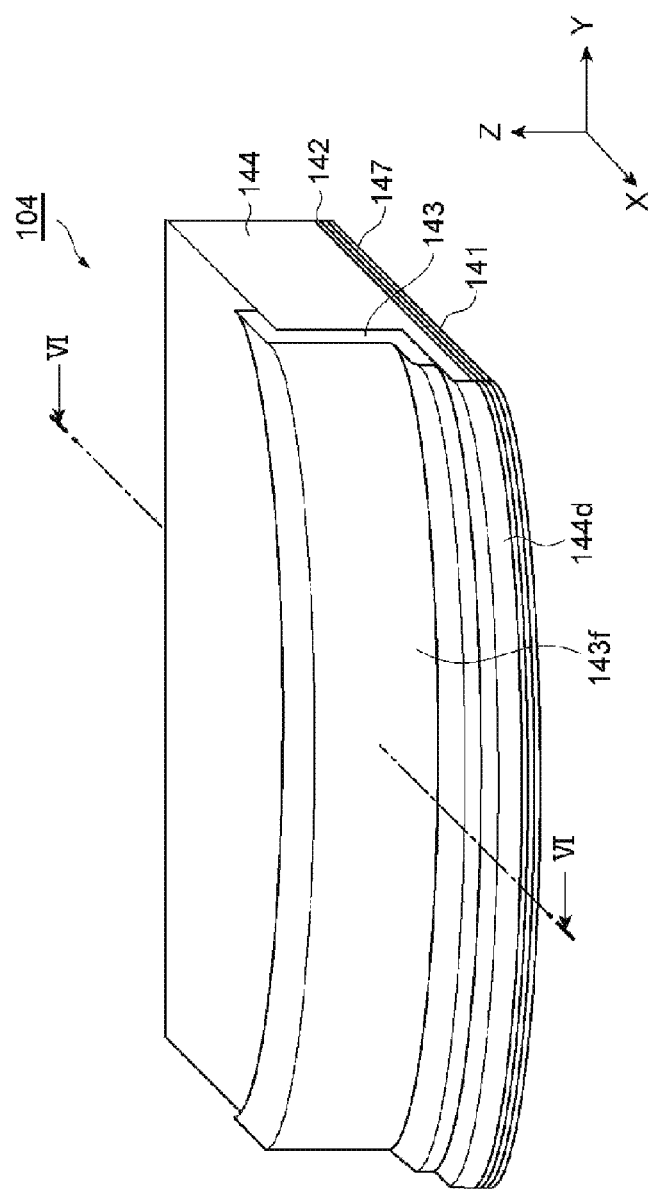
FIG. 5 is a perspective view showing an example of a sensor chip.
Figure 6:
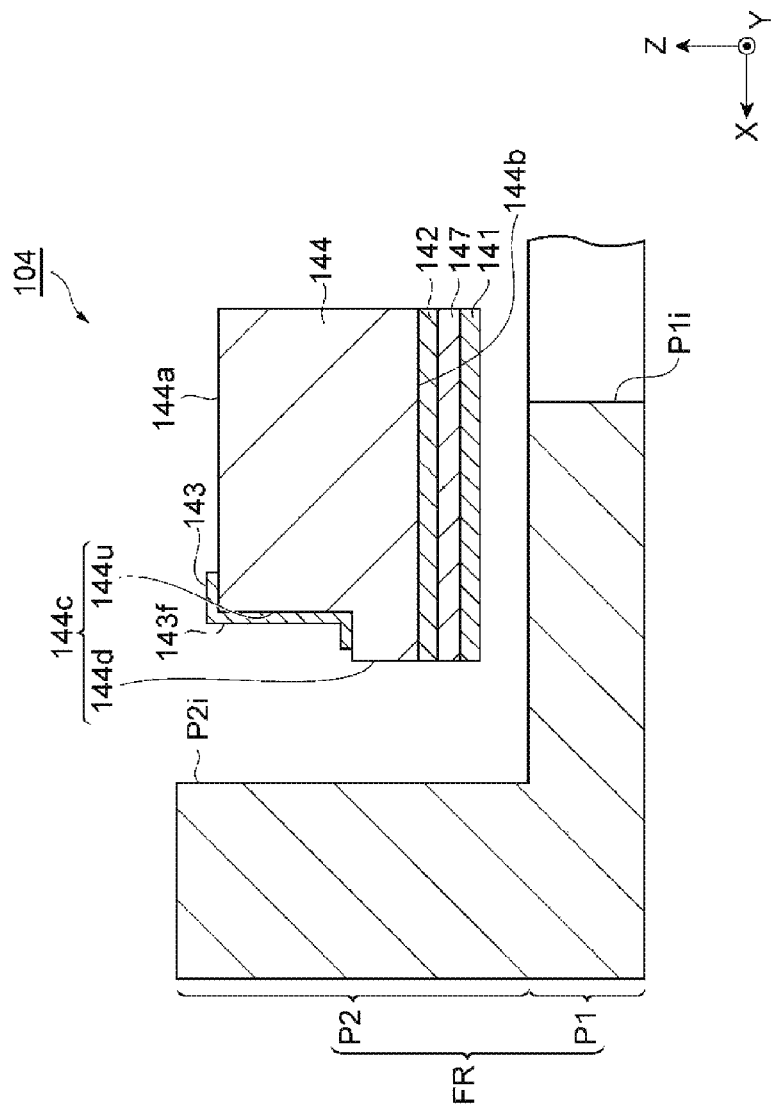
FIG. 6 is a cross sectional view taken along a line VI-VI of FIG. 5.

FIG. 5 is a perspective view of a sensor chip according to an embodiment. FIG. 6 is a cross sectional view taken along a line VI-VI of FIG. 5. The sensor chip 104 shown in FIGS. 5 and 6 is used as the sensor chips 104A to 104H of the measuring device 100. In the following description, the XYZ orthogonal coordinate system will be appropriately referred to. The X direction indicates frontward direction of the sensor chip 104. The Y direction indicates a width direction of the sensor chip 104 which is orthogonal to the X direction. The 7, direction indicates an upward direction of the sensor chip 104 which is orthogonal to the X direction and the Y direction.

The sensor chip 104 includes an electrode 141, a guard electrode 142, a sensor electrode 143, a substrate member 144, and an insulating region 147.

The substrate member 144 is made of, e.g., borosilicate glass or quartz. The substrate member 144 has an upper surface 144a, a bottom surface 144b, and a front end surface 144c. The guard electrode 142 is provided below the bottom surface 144b of the substrate member 144 and extends in the X direction and the Y direction. The electrode 141 is provided below the guard electrode 142 with the insulating region 147 interposed therebetween, and extends in the X direction and the Y direction. The insulating region 147 is made of, e.g., $SiO_2$, $SiN$, $Al_2O_3$, or polyimide.

The front end surface 144c of the substrate member 144 is formed in a stepped shape. A lower portion 144d of the front end surface 144c protrudes toward the focus ring FR compared to an upper portion 144u of the front end surface 244c. The sensor electrode 143 extends along the upper portion 144u of the front end surface 240o. In one embodiment, the upper portion 144u and the lower portion 144d of the front end surface 144c may be curved surfaces having predetermined curvatures. In other words, the upper portion 144u of the front end surface 144c has a constant curvature at any position thereof, and the curvature of the upper portion 144u is a reciprocal of a distance between the central axis AX100 of the measuring device 100 and the upper portion 144u of the front end surface 144c. The lower portion 144d of the front end surface 144c has a constant curvature at any position thereof, and the curvature of the lower portion 144d is a reciprocal of a distance between the central axis AX100 of the measuring device 100 and the lower part 144d of the front end surface 144c.

The sensor electrode 143 is provided along the upper portion 144u of the front end surface 144c. In one embodiment, a front surface 143f of the sensor electrode 143 is a curved surface. In other words, the front surface 143f of the sensor electrode 143 has a constant curvature at any position thereof, and the curvature of the front surface 143f a reciprocal of a distance between the central axis AX100 of the measuring device 100 and the front surface 143f.

In the case of using the sensor chip 104 as a sensor of the measuring device 100, the electrode 141 is connected. to the wiring 181; the guard electrode 142 is connected to the wiring 182; and the sensor electrode 143 is connected to the wiring 183, which will be described later.

In the sensor chip 104, the sensor electrode 143 is shielded from the bottom of the sensor chip 104 by the sensor electrode 143, the electrode 141 and the guard electrode 142. Therefore, in accordance with the sensor chip 104, the electrostatic capacitance can be measured with high directivity in a specific direction (K direction) in which the front surface 143f of the sensor electrode 143 is directed.

Figure 7:
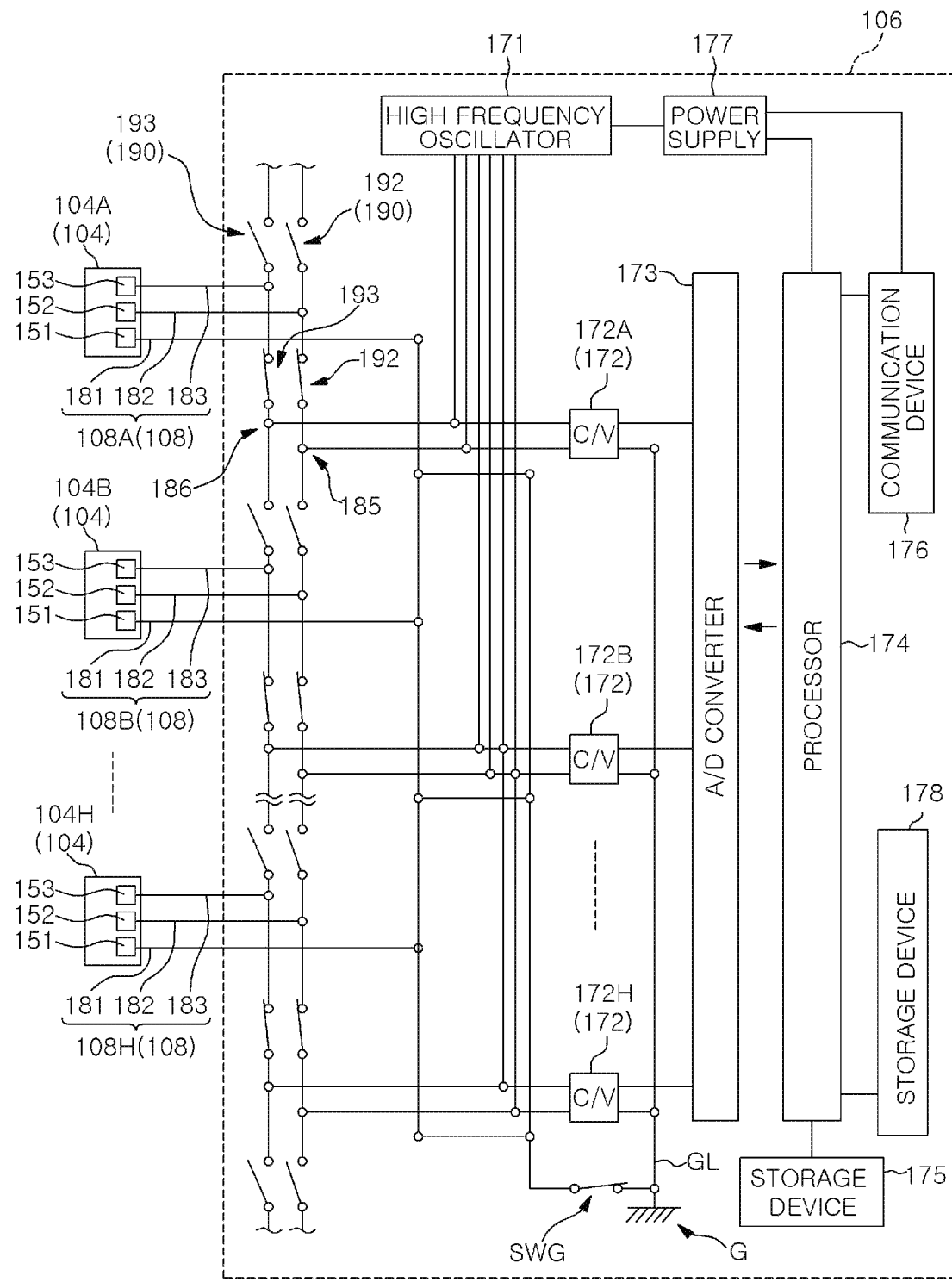
FIGS. 7 and 8 show examples of configurations of a circuit board of the measuring device.
Figure 8:
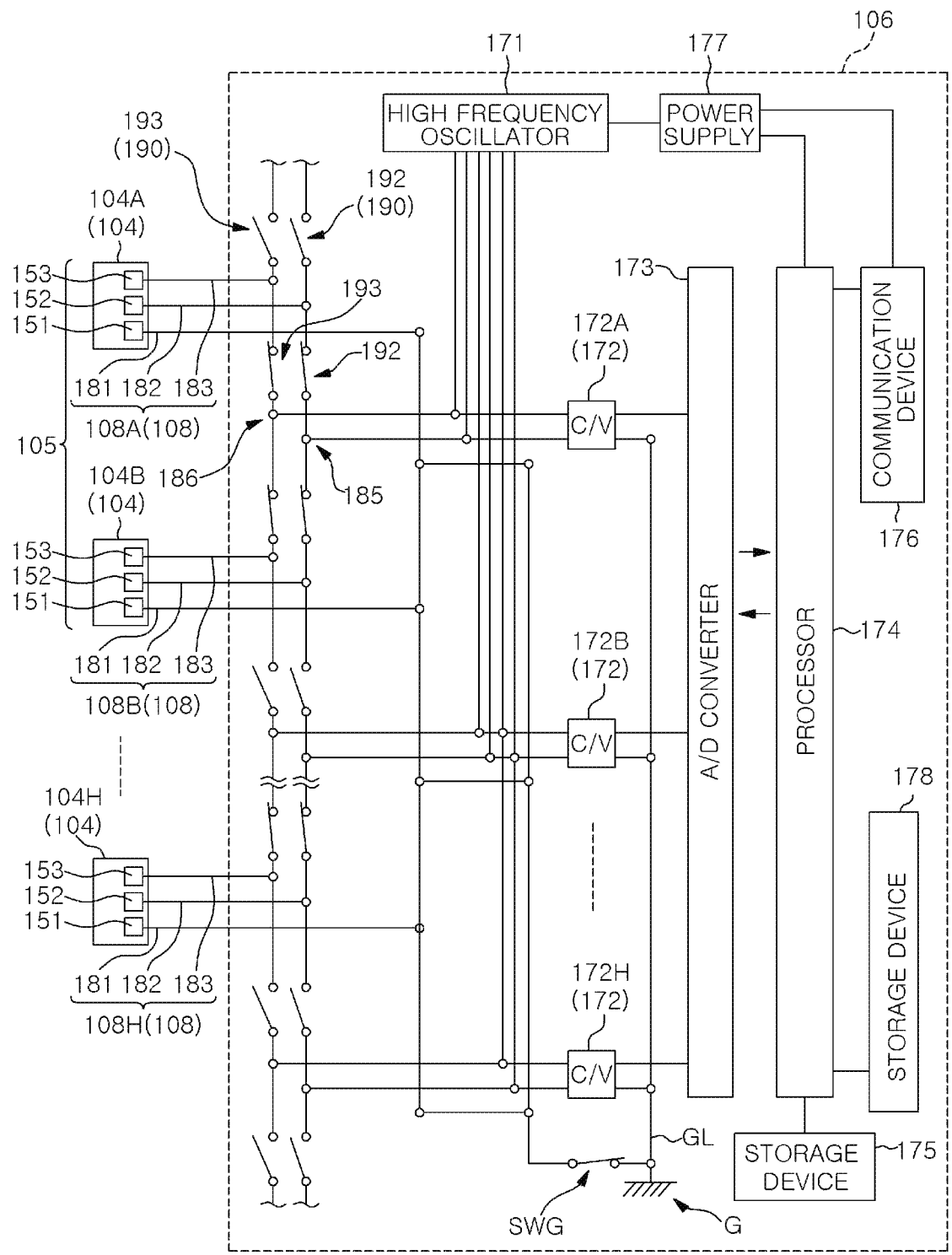

Hereinafter, the configuration of the circuit board 106 will be described. FIGS. 7 and 8 show examples of the configurations of the circuit board of the measuring device 10. FIG. 7 shows a connection state obtained in a single mode to be described later. FIG. 8 shows a connection state obtained in a dual mode. As illustrated, the circuit board 106 includes a high frequency oscillator 171, a plurality of C/V conversion circuits 172A to 172H, a switching mechanism 190, an A/D converter 173, a processor (operation unit) 174, a storage device 175, a communication device 176, and a power supply 177.

Each of the sensor chips 104A to 104H is connected to the circuit board 106 through a corresponding wiring group among the wiring groups 108A to 108H. Further, each of the sensor chips 104A to 104H is connected to a corresponding C/V conversion circuit among the C/V conversion circuits 172A to 172H through some wirings included in the corresponding wiring group. The following is description on a single sensor chip 104 having the same configuration as that of each of the sensor chips 104A to 104H, a single wiring group 108 having the same configuration as that of each of the wiring groups 108A to 108H, a single C/V conversion circuit 172 having the same configuration as that of each of the C/V conversion circuits 172A to 172H, and the switching mechanism 190.

The wiring group 108 includes wirings 181 to 183. One end of the wiring 181 is connected to a pad 151 connected to the electrode 141. The wiring 181 is connected to a ground potential line 131 connected to a ground G of the circuit board 106. The wiring 181 may be connected to the ground potential line GL via a switch SWG. One end of the wiring 182 is connected to a pad 152 connected to the guard electrode 142, and the other end of the wiring 182 is connected to the C/V conversion circuit 172. One end of the wiring 183 is connected to a pad 153 connected to the sensor electrode 143, and the other end of the wiring 183 is connected to the C/V conversion circuit 172.

The high frequency oscillator 171 is connected to the power supply 177 such as a battery. The high frequency oscillator 171 is configured to receive power from the power supply 177 and generate a high frequency signal. The power supply 177 is also connected to the processor 174, the storage device 175, and the communication device 176. The high frequency oscillator 171 has a plurality of output lines. The high frequency oscillator 171 is configured to apply the generated high frequency signal to the wirings 182 and 183 through the output lines. Therefore, the high frequency oscillator 171 is electrically connected to the guard electrode 142 and the sensor electrode 143 of the sensor chip 104, and the high frequency signal from the high frequency oscillator 171 is applied to the guard electrode 142 and the sensor electrode 143.

The wirings 182 and 183 are connected to an input of the C/V conversion circuit 172. In other words, the guard electrode 142 and the sensor electrode 143 of the sensor 104 are connected to the input of the C/V conversion circuit 172. The C/V conversion circuit 172 is configured to generate a voltage signal having an amplitude corresponding to the potential difference at the input thereof and output the corresponding voltage signal. As the electrostatic capacitance of the sensor electrode connected to the C/V conversion circuit 172 is increased, the magnitude of the voltage signal outputted from the C/V conversion circuit 172 is increased.

The switching mechanism 190 can switch the measurement mode of the sensor electrodes 143 to either a single mode (first state) or a dual mode (second state). In the single mode, the sensor electrodes 143 are electrically connected to corresponding C/V conversion circuits 172, respectively (see FIG. 7). In the dual mode, there is provided a plurality of electrode pairs 105, each including two adjacent sensor electrodes 143 in the circumferential direction among the sensor electrodes 143 (see FIG. 8). In the dual mode, the electrode pairs 105 are electrically connected to one of two C/V conversion circuits 172 respectively corresponding to two sensor electrodes 143. In other words, in the second state, the electrode pairs 105 are electrically connected to different C/V conversion circuits 172 among the C/V conversion circuits 172.

In one embodiment, two wirings 183 connected to two adjacent sensor chips 104 in the circumferential direction are connected to each other and inputted to the conversion circuit 172 corresponding to one of the sensor chips 104. A switch 193 constituting the switching mechanism 190 is disposed between a connection node 186 of the two wirings 183 and each of two pads 153. Further, two wirings 182 connected to two circumferentially adjacent sensor chips 104 are connected to each other and inputted to the C/V conversion circuit 172 corresponding to one of the sensor chips 104. A switch 192 constituting the switching mechanism 190 is disposed between a connection node 185 of the two wirings 182 and each of two pads 152. The switches 192 and 193 have a mechanism that can be switched between a state in which wirings are connected and a state in which wirings are disconnected. The switches 192 and 193 may be electronic switches such as a transistor or the like, or may be mechanical switches.

In the case of the sensor chips 104A and 104B, in the single mode shown in FIG. 7, the sensor chip 104A and the C/V conversion circuit 172A are connected; the sensor chip 104B and the C/V conversion circuit 172A are disconnected; and the switches 192 and 193 are controlled to connect the sensor chip 104B and the C/V conversion circuit 172B. In the dual mode shown in FIG. 8, the sensor chip 104A and the C/V conversion circuit 172A are connected; the sensor chip 104B and the C/V conversion. circuit 172A are connected; and the switches 192 and 193 are controlled to disconnect the sensor chip 104B and the C/V conversion circuit 172B. In this control, the electrode pair 105 is formed by combining the sensor chips 104A and 104B. The wiring that connects the sensor chip 104A and the C/V conversion circuit 172A and the wiring that connects the sensor chip 104B and the C/V conversion circuit 172A are designed to synchronize the voltage amplitudes of the sensor chips 104A and 104B. For example, the wirings may be designed such that the impedances of two wirings are matched. In the dual mode in which the sensor chips 104A and 104B form the electrode pair 105, the sensor chips 104C and 104D form the electrode pair 105; the sensor chips 104E and 104F form the electrode pair 105; and the sensor chips 104G and 104H form the electrode pair 105.

In one embodiment, the combination of two adjacent sensor electrodes 143 in the electrode pairs 105 can be changed by switching the switches 192 and 193. In other words, in another dual mode, the sensor chips 104A and 104H may form the electrode pair 105; the sensor chips 104B and 104C may form the electrode pair 105; the sensor chips 104D and 104E may form the electrode pair 105; and the sensor chips 104F and 104G may form the electrode pair 105.

The output of the C/V conversion circuit 172 is connected to the input of the A/D converter 173. The A/D converter 173 is connected to the processor 174. The A/D converter 173 is controlled by a control signal from the processor 174. The A/D converter 173 converts the output signal (voltage signal) of the C/V conversion circuit 172 to a digital value and outputs the digital value as a detection value to the processor 174. In the single mode, each of the sensor chips 104 is connected to the corresponding C/V conversion circuit 172. Therefore, the A/D converter 173 outputs the detection values of the sensor chips 104 to the processor. In the dual mode, two sensor chips 104 forming one electrode pair 105 are connected to one C/V conversion circuit 172. Accordingly, the A/D converter 173 outputs the sum of the detection values of two sensor chips 104 forming the electrode pair 105 to the processor 174.

The storage device 175 is connected to the processor 174. The storage device 175 is, e.g., a volatile memory, and is configured to store measurement data to be described later. Another storage device 178 is connected to the processor 174. The storage device 178 is, e.g., nonvolatile memory, and is configured to store a program that is read out and executed by the processor 174.

The communication device 176 conforms to any wireless communication standard. For example, the communication device 176 conforms to Bluetooth (registered trademark). The communication device 176 is configured to wirelessly transmit the measurement data stored in the storage device 175.

The processor 174 is configured to control the respective components of the measuring device 100 by executing the above-described program. For example, the processor 174 is configured to control the supply of the high frequency signal from the high frequency oscillator 171 to the guard electrode 142 and the sensor electrode 143, the supply of power from the power supply 177 to the storage device 175, the supply of power from the power supply 177 to the communication device 176, and the like. Further, the processor 174 executes the above-described program to acquire the measurement value of the sensor chip 104 based on the detection value inputted from the A/D converter 173. The sensor chip is configured to control switching of the switches by executing the above-described program.

In the measuring device 100, the sensor electrodes 143 and the guard electrodes 142 face the inner periphery of the focus ring FR in a state where the measuring device 100 is disposed in a region surrounded by the focus ring FR. The measurement value generated based on the potential difference between the signal of the sensor electrode 143 and the signal of the guard electrode 142 indicates an electrostatic capacitance that reflects the distance between each of the sensor electrodes 143 and the focus ring. The electrostatic capacitance C is represented by C=εS/d. "ε" represents a dielectric constant of a medium between the front surface 143f of the sensor electrode 143 and the inner periphery of the focus ring FR; "S" represents an area of the front surface 143f of the sensor electrode 143; and "d" represents a distance between the front surface 143f of the sensor electrode 143 and the inner periphery of the focus ring FR. Therefore, in accordance with the measuring device 100, the measurement data that reflects the relative positional relation between the focus ring FR and the measuring device 100 that imitates the target object W can be obtained. For example, the plurality of measurement values obtained by the measuring device 100 is decreased as the distance between the front surface 143f of the sensor electrode 143 and the inner periphery of the focus ring FR is increased.

The following is description on a method of obtaining the amount of deviation of the central position (central axis AX100) of the measuring device 100 disposed in a region surrounded by the focus ring FR with respect to the central position (central axis AXF) of the corresponding region.

First, the method of obtaining the amount of deviation of the central position of the measuring device 100 is the single mode will be described. The amount of deviation is the amount of deviation of the central position of the measuring device 100 disposed in a region surrounded by the focus ring with respect to the central position of the region.

Figure 9:
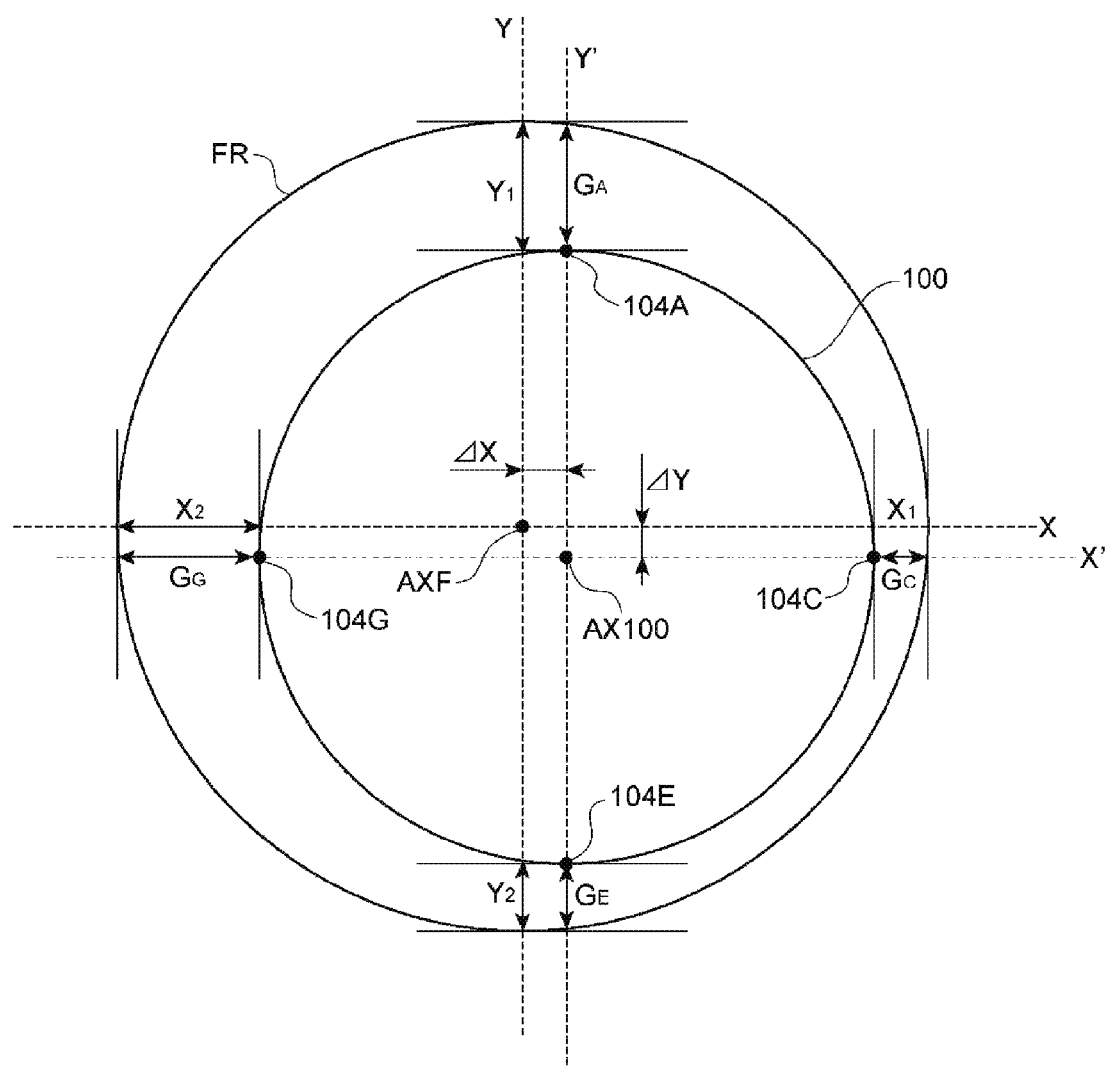
FIGS. 9 and 10 schematically show the positional relation between a focus ring and the measuring device.

FIG. 9 schematically shows positional relation between the focus ring FR and the measuring device 100 disposed at an inner side of the focus ring FR. In FIG. 9, an inner periphery of the focus ring FR and an edge of the measuring device 100 are shown. Further, in FIG. 9, an orthogonal coordinate system having the X-axis an the Y-axis with the central position of the focus ring FR as the origin and an orthogonal coordinate system having the X'-axis and the Y'-axis with the central position of the measuring device 100 as the origin are shown. In the illustrated example, the Y'-axis is set to pass through the sensor chips 104A and 104E and the central position. Further, the X'-axis is set to pass through the sensor chips 104C and 104E and the central position. In the following method, the amount of deviation ΔY of the central position of the measuring device 100 in the Y-axis direction is calculated based on the sensor chips 104A and 104E, and the amount of deviation ΔX a of the central position of the measuring device 100 in the X-axis direction is calculated based on the sensor chips 104C and 104G. Therefore, in FIG. 9, other sensor chips 104B, 104D, 104E and 104H are not illustrated. Further, the amount of deviation of the central position of the measuring device 100 can be calculated based on the other sensor chips 104B, 104D, 104F and 104H by changing the setting of the X-axis direction and the Y-axis direction.

Hereinafter, a method of deriving ΔX and ΔY will be described. In the present embodiment, in the sensor chips 104A and 104E, the sum of the shortest distances from the sensor electrodes 143 to the inner peripheral surface of the focus ring FR becomes a constant value. Further, in the sensor chips 104C and 104G, the sum of the shortest distances from the sensor electrodes 143 to the inner peripheral surface of the focus ring FR becomes a constant value. In the illustrated example, an inner diameter $D_f$ of the focus ring FR is 302 mm and an outer diameter $D_w$ of the measuring device 100 is 300 mm. In that case, on the assumption that the shortest distances from the sensor chips 104A, 104C, 104E and 104G to the inner periphery of the focus ring FR are respectively $G_A$, $G_C$, $G_E$ and $G_G$, the following Eqs. (1) and (2) are satisfied.

$$G_A + G_E = D_f - D_w = 2.00 \text{ mm} \quad \text{Eq. (1)}$$

$$G_C + G_G = D_f - D_w = 2.00 \text{ mm} \quad \text{Eq. (2)}$$

On the assumption that the measurement values (electrostatic capacitances) of the sensor chips 104A, 104C, 104E and 104G are respectively $C_A$, $C_C$, $C_E$ and $C_G$, conditions $G_A = a/C_A$, $G_C = a/C_C$, $G_E = a/C_E$ and $G_G = a/C_G$ are satisfied. In other words, the above Eqs. (1) and (2) are converted to the following Eqs. (3) and (4).

$$(a/C_A) + (a/C_E) = 2.00 \text{ mm} \quad \text{Eq. (3)}$$

$$(a/C_C) + (a/C_G) = 2.00 \text{ mm} \quad \text{Eq. (4)}$$

In the case of deriving ΔX and ΔY, first, the measurement values $C_A$, $C_C$, $C_E$ and $C_G$ are acquired. By substituting the measurement values $C_A$, $C_C$, $C_E$ and $C_C$ into the above Eqs. (3) and (4), the constant "a" can be obtained. The measurement values $G_A$, $G_C$, $G_E$ and $G_G$ are derived from the constant "a" and the respective measurement values $C_A$, $C_C$, $C_E$ and $C_G$.

Since ΔY can be defined as ½ of the difference between $Y_2$ and $Y_1$, ΔY is obtained from the distances $G_A$ and $G_E$ as shown in the following Eq. (5).

$$\Delta Y = (G_E - G_A)/2 \quad \text{Eq. (5)}$$

Similarly, since ΔX can be defined as ½ of the difference between $X_2$ and $X_1$, ΔX is obtained from the distances $G_C$ and $G_G$ as in the following Eq. (6).

$$\Delta X = ((G_G - G_C)/2 \qquad \text{Eq. (6)}$$

As described above, the amount of deviation between the central position of the focus ring FR and the central axis AX100 of the measuring device 100 disposed at the inner side of the focus ring FR can be calculated as the amount of deviation ΔX in the X-axis direction and the amount of deviation ΔY in the Y-axis direction.

Figure 10:
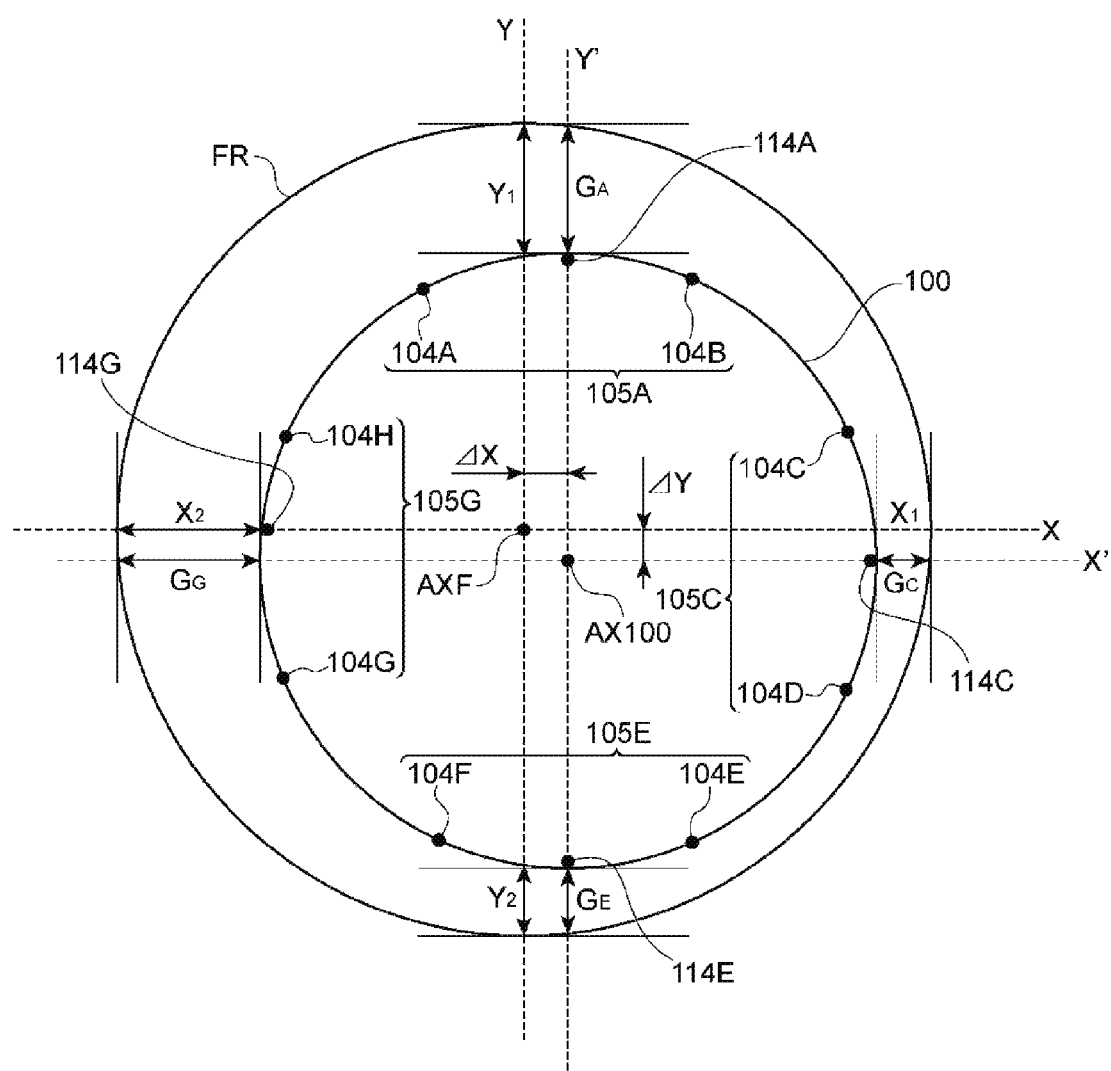

Next, the method of obtaining the amount of deviation of the central position of the measuring device 100 in the dual mode will be described. FIG. 10 schematically shows the positional relation between the focus ring FR and the measuring device 100 disposed at the inner side of the focus ring FR. In FIG. 10, an inner periphery of the focus ring FR and an edge of the measuring device 100 are shown. Further, in FIG. 10, an orthogonal coordinate system having the X-axis and the Y-axis with the central position of the focus ring FR as the origin and an orthogonal coordinate system having the X'-axis and the Y'-axis with the central position of the measuring device 100 as the origin are shown.

In the illustrated example, the sensor chips 104A and 104B form the electrode pair 105; the sensor chips 104C and 104D form the electrode pair 105; the sensor chips 104E and 104E form the electrode pair 105; and the sensor chips 104G and 104H form the electrode pair 105. Therefore, the Y'-axis set to pass through an intermediate point 114A in the circumferential direction of the sensor chips 104A and 104B, an intermediate point 114E in the circumferential direction of the sensor chips 104E and 104F and the central position. Further, the X'-axis is set to pass through an intermediate point 114C in the circumferential direction of the sensor chips 104C and 104D, an intermediate point 114G in the circumferential direction of the sensor chips 104G and 104H, and the central position.

Hereinafter, a method of deriving ΔX and ΔY in the dual mode will be described. For the convenience of description, it is assumed that the sensor chips 104A and 104B form the electrode pair 105A; the sensor chips 104C and 104D form the electrode pair 105C; the sensor chips 104E and 104F form the electrode pair 105E; and the sensor chips 104E and 104H form the electrode pair 105G.

In the present embodiment, in the sensor chips 105A and 105E, the sum the shortest distances from the intermediate points to the inner peripheral surface of the focus ring FR becomes a constant value. Further, in the sensor chips 105C and 105G, the sum of the shortest distances from the intermediate points to the inner peripheral surface of the focus ring FR becomes a constant value. In the illustrated example, the inner diameter $D_f$ of the focus ring FR is 302 mm and the outer diameter $D_w$ of the measuring device 100 is 300 mm. In that case, on the assumption that the shortest distances from the intermediate points of the electrode pairs 105A, 1050, 105E and 105G to the inner periphery of the focus ring FR are respectively $G_A$, $G_C$, $G_E$ and $G_G$, the following Eqs. (7) and (8) are satisfied.

$$G_A + G_E = D_f - D_w = 2.00 \text{ mm} \qquad \text{Eq. (7)}$$

$$G_C + G_G = D_f - D_w = 2.00 \text{ mm} \qquad \text{Eq. (8)}$$

On the assumption that the measurement values (electrostatic capacitances) of the sensor chips 105A, 105C, 105E and 105G are respectively $C_A$, $C_C$, $C_E$ and $C_G$, conditions $G_A = a/C_A$, $G_C = a/C_C$, $G_E = a/C_E$ and $G_G = a/C_G$ are satisfied. In other words, the above Eqs. (7) and (8) are converted to the following Eqs. (9) and (10).

$$(a/C_A) + (a/C_E) = 2.00 \text{ mm} \qquad \text{Eq. (9)}$$

$$(a/C_C) + (a/C_G) = 2.00 \text{ mm} \qquad \text{Eq. (10)}$$

In the case of deriving ΔX and ΔY, first, the measurement values $C_A$, $C_C$, $C_E$ and $C_G$ are acquired. By substituting the measurement values $C_A$, $C_C$, $C_E$ and $C_G$ into the above Eqs. (9) and (10), the constant can be obtained. The measurement values $G_A$, $G_C$, $G_E$ and $G_G$ are derived from the constant "a" and the respective measurement values $C_A$, $C_C$, $C_E$ and $C_G$.

Since ΔY can be defined as ½ of the difference between $Y_2$ and $Y_1$, ΔY is obtained from the distances $G_A$ and $G_E$ as shown in the following Eq. (11).

$$\Delta Y = (G_E - G_A)/2 \qquad \text{Eq. (11)}$$

Similarly, since ΔX can be defined as ½ of the difference between $X_2$ and $X_1$, ΔX is obtained from the distances $G_C$ and $G_G$ as in the following Eq. (12).

$$\Delta X = ((G_G - G_C)/2 \qquad \text{Eq. (12)}$$

As described above, the amount of deviation between the central position of the focus ring FR and the central axis AX100 of the measuring device 100 disposed at the inner side of the focus ring FR can be calculated as the amount of deviation ΔX in the X-axis direction and the amount of deviation ΔY in the Y-axis direction.

Next, the method of obtaining the amount of deviation. of the central position of the measuring device 100, i.e., the method of obtaining an error of the transfer position. data of the measuring device 100, will be described. As described above, the transfer unit TU2 in the processing system 1 is controlled by the control unit MC. In one embodiment, the transfer unit TU2 can transfer the target object W and the measuring device 100 onto the mounting region surrounded by the focus ring FR based on the transfer position data transmitted from the control unit MC. FIG. 11 is a flowchart showing an example of the method of obtaining the amount of deviation of the central position of the measuring device.

In the method shown in FIG. 11, first, a step ST1 is executed. In the step ST1, the measuring device 100 is transferred by the transfer unit TU2 to the position on the mounting region specified by the transfer position data. Specifically, the transfer unit TU1 transfers the measuring device 100 to one of the load-lock modules LL1 and LL2. Then, based on the transfer position data, the transfer unit TU2 transfers the measuring device 100 from one of the load-lock modules to any one of the process modules PM1 to PM6, and mounts the measuring device 100 on the mounting region of the electrostatic chuck ESC. The transfer position data are coordinate data that are determined in advance such that the position of the central axis AX100 of the measuring device 100 coincides with the central position of the focus ring FR.

Next, in a step ST2, the amount of deviation of the central position of the measuring device 100 in the single mode is measured (rough accuracy measurement). Specifically, in a state where the switching mechanism 190 is switched to the single mode, the measuring device 100 obtains a plurality digital values (first measurement values) corresponding to the magnitudes of the electrostatic capacitances between the focus ring FR and the sensor electrodes 143 of the sensor chips 104A to 104H and stores the digital values in the storage device 175.

Next, in a step ST3, the position of the measuring device 100 is adjusted (rough adjustment) using the amount of deviation of the central position of the measuring device 100. In this step, the amount of deviation between the central position of the focus ring FR and the central position of the measuring device 100 is derived based on the above-described method of obtaining the amount of deviation in the single mode. The amount of deviation of the central position of the measuring device 100 derived by the control unit MC, for example. The transfer position data is calibrated by the control unit MC to eliminate the amount of deviation. Then, the position of the measuring device 100 is adjusted using the calibrated transfer position data.

In the step ST3 of one embodiment, first, the digital values stored in the storage device 175 are transmitted to the control unit MC. The digital values may be transmitted from the communication device 176 to the control unit MC by a command from the control unit MC or may be transmitted to the control unit MC at predetermined timing under the control of the processor 174 based on counting of a timer provided in the circuit board 106. Next, the control unit MC derives the amount of deviation of the central position of the measuring device 100 at the transfer position of the measuring device 100 based on the received digital values. The measuring device 100 is transferred again to the same process module.

Next, in a step ST4, the amount of deviation of the central position of the measuring device 100 in the single mode is measured again (second rough accuracy measurement). Specifically, in a state in which the switching mechanism 190 is switched to the single mode, the measuring device 100 acquires a plurality of digital values (third measurement values) corresponding to the magnitudes of the electrostatic capacitances between the focus ring FR and the sensor electrodes 143 of the sensor chips 104A to 104H and stores the digital values in the storage device 175. Then, the amount of deviation between the central position of the focus ring FR and the central position of the measuring device 100 is derived from the acquired measurement values.

Next, in a step ST5, the amount of deviation of the central position of the measuring device 100 which is measured in the step ST4 is checked (measurement result check). For example, in the step ST5, it is checked that the amount of deviation between the central position of the focus ring FR and the central position of the measuring device 100 is equal to or less than a predetermined threshold value. For example, the predetermined threshold value corresponds to the amount of deviation of the central position of the measuring device 100 under the condition that the measurement can be appropriately performed without excessively increasing the measurement value when the switching mechanism 190 is switched to the dual mode.

Next, in a step ST6, the amount of deviation of the central position of the measuring device 100 in the dual mode is measured (high-accuracy measurement). Specifically, in a state in which the switching mechanism 190 is switched to the dual mode, the measuring device 100 acquires a plurality of digital values (second measurement value) corresponding to the magnitudes of the electrostatic capacitances between the focus ring FR and the electrode pairs 105 including the sensor chips 104A to 104H and stores the digital values in the storage device 175. Then, the amount of deviation between the central position of the focus ring FR and the central position of the measuring device 100 is derived from the acquired measurement value.

Next, in a step ST7, the position of the measuring device 100 on the region is re-adjusted (fine adjustment) by using the amount of deviation of the central position of the measuring device 100 which is derived from the second measurement value.

Next, in a step ST8, the amount of deviation of the central position of the measuring device 100 in the dual mode is measured again (second high-accuracy measurement). In other words, after the position of the measuring device 100 on the region is re-adjusted, the amount of deviation of the central position of the measuring device 100 is derived from the digital values (fourth measurement values) acquired in the dual mode.

Next, in a step ST9, the amount of deviation measured in the step ST8 is checked (measurement result check). For example, in the step ST9, it is checked that the amount of deviation of the central position of the measuring device 100 is within an allowable range in the operation of the transfer unit TU2. If the magnitude of the amount of deviation of the central position of the measuring device 100 is not within the allowable range in the operation of the transfer unit TU2, the transfer position may be adjusted again by calibrating the transfer position data.

In the above-described measuring device 100, the measurement values obtained from the voltage amplitudes of the sensor electrodes 143 indicate the electrostatic capacitance between the sensor electrodes 143 and the focus ring FR disposed in front of the sensor electrodes 143. Since the electrostatic capacitance is in inverse proportion to the distance between the sensor electrode 143 and the focus ring FR, as the distance between the sensor electrode 143 and the focus ring FR is increased, the measurement value is decreased and the sensitivity of the sensor is decreased. In that case, the area of the sensor electrode 143 can be increased. However, if the area of the sensor electrode 143 is increased, when the distance between the sensor electrode 143 and the focus ring FR is small, the measurement value becomes excessively large, which makes proper measurement impossible.

In one embodiment, the connection between the sensor electrodes 143 and the C/V conversion circuit 172 can be switched between the single mode and the dual mode. When the distance between the sensor electrode 143 and the focus ring FR is small, the excessive increase in the measurement value can be suppressed by switching to the single mode. When the distance between the sensor electrode 143 and the focus ring FR is large, the mode is set to the dual mode. In the dual mode, it is possible to substantially increase the area of the sensor electrode and increase the sensitivity of the sensor by using two sensor electrodes as one sensor. Since the mode can be switched between the single mode and the dual mode by the switching mechanism 190, the amount of deviation of the central position of the measuring device can be obtained with high accuracy depending on the circumstances.

The combination of two adjacent sensor electrodes 143 included in the electrode pairs 105 can be changed. In this configuration, in the case of selecting one of two sensor electrodes 143 forming the electrode pair 105, it is possible to select a more proper one between sensor electrodes 143 adjacent to the circumferentially opposite sides of the other of the two sensor electrodes 143.

In the above-described method, the position of the measuring device 100 on the region is re-adjusted by using the amount of deviation of the central position of the measuring device 100 which is derived from the second measurement value acquired in the step ST6. In this configuration, the position of the measuring device 100 is re-adjusted based on the amount of deviation of the central position of the measuring device 100 which is obtained with high accuracy and, thus, the deviation of the central position of the measuring device 100 can be further suppressed.

The above-described method includes a step of deriving the amount of deviation of the central position of the measuring device 100 from the measurement value acquired in the dual mode after the position of the measuring device 100 on the region is re-adjusted. With this configuration, the amount of deviation of the central position of the measuring device 100 after the re-adjustment can be obtained with high accuracy.

In the embodiments, the measurement value of the electrostatic capacitance can be appropriately obtained without depending on the distance between the electrode and the target object.

Although the embodiment has been described above, various modifications can be made without being limited to the above-described embodiment.

For example, in the step ST6, based on the measurement values (third measured values) obtained in the step S14, the electrode pair 105 may be constituted by two adjacent sensor electrodes 142 with a straight extension line that connects the central position of the measuring device 100 disposed in the focus ring FR and the central position of the region in the focus ring FR interposed therebetween. This etension line passes through a position where the measuring device 100 is the closest to the focus ring FR and a position where the measuring device 100 is farthest from the focus ring FR. With the configuration in which the electrode pair 105 includes two sensor electrodes 143 adjacent to the extension line, the measurement values at the position where the measuring device 100 is the closest to the focus ring FR and the position where the measuring device 100 is farthest from the focus ring FR can be obtained with high accuracy. In the step ST6, it is unnecessary to derive the position of the extension line, and two sensor electrodes constituting the electrode pair may be adjacent to each other with the extension line interposed therebetween. For example, in the example shown in FIG. 10, the extension line passes between the sensor chips 104A and 104H and between the sensor chips 104D and 104E. In that case, the sensor chips 104A and 104H form the electrode pair 105; the sensor chips 104B and 104C form the electrode pair 105; the sensor chips 104D and 104E form the electrode pair 105; and the sensor chips 104F and 104G form the electrode pair 105.

For example, the number of sensor chips mounted on the measuring device is not limited to that in the above embodiments. The number of sensor chips may vary as long as the switching between the single mode and the dual mode is feasible. For example, when it is desired to acquire only the amount of deviation of the central position of the measuring device 100 in the uniaxial direction, the number of sensor chips may be four, for example.

While the present disclosure has been shown and described with respect to the embodiments, it will be understood by those skilled in the art that various changes and modifications may be made without departing from the scope of the present disclosure as defined is the following claims.

The invention claimed is:

1. A measuring device comprising:
    a disc-shaped base substrate;
    a plurality of sensor electrodes arranged in circumferential direction along a periphery of the base substrate;
    a high frequency oscillator configured to apply a high frequency signal to the sensor electrodes;
    a plurality of C/V conversion circuits, each being configured to convert a voltage amplitude at a corresponding sensor electrode among the plurality of sensor electrodes to a voltage signal indicating an electrostatic capacitance;
    an A/D converter configured to convert the voltage signal outputted from each of the C/V conversion circuits to a digital value; and
    a switching mechanism configured to switch each sensor electrode of the plurality of sensor electrodes between a first state in which the sensor electrodes are electrically connected to the C/V conversion circuits and a second state in which a plurality of electrode pairs, each pair including two sensor electrodes adjacent in the circumferential direction among the sensor electrodes, are connected to different C/V conversion circuits among the C/V conversion circuits.

2. The measuring device of claim 1, wherein a combination of the two adjacent sensor electrodes included in each of the electrode pairs is changeable.

3. A method for obtaining the amount of deviation of the measuring device described in claim 1 that is transferred by a transfer unit,
    wherein the transfer unit transfers a target object into a region surrounded by a focus ring based on transfer position data, and
    the amount of deviation is the amount of deviation of a central position of the measuring device disposed in the region with respect to a central position of the region, the method comprising:
    transferring the measuring device to a position in the region specified by the transfer position data by using the transfer unit;
    calculating, as plurality of first measurement values, a plurality of digital values including the digital values obtained from the voltage signals outputted from the C/V conversion circuits in the first state;
    adjusting a position of the measuring device by using calibrated transfer position data obtained by calibrating the transfer position data based on the amount of deviation of a central position of the measuring device with respect to a central position of the area that is obtained from the first measurement values; and
    deriving the amount of deviation of the central position of the measuring device with respect to the central position of the region from a plurality of second measurement values after the position of the measuring device is adjusted,
    wherein the second measurement values are a plurality of digital values including the digital values obtained from the voltage signals outputted from the different conversion circuits in the second state.

4. The method of claim 3, further comprising: re-adjusting the position of the measuring device by using the transfer position data calibrated by using the amount of deviation derived from the second measurement values.

5. The method of claim 4, further comprising: after said re-adjusting the position of the measuring device, deriving the amount of deviation of the central position of the measuring device with respect to the central position of the region from a plurality of fourth measurement values that is a plurality of digital values including the digital values obtained from the voltage signals outputted from the different C/V conversion circuits in the second state.

6. The method of claim 3, wherein in the measuring device, a combination of the two adjacent sensor electrodes included. is each of the electrode pairs is changeable.

7. The method of claim 6, further comprising: re-adjusting the position of the measuring device by using the transfer position data calibrated by using the amount of deviation derived from the second measurement values.

8. The method of claim 7, further comprising: after said re-adjusting the position of the measuring device, deriving the amount of deviation of the central position of the measuring device with respect to the central position of the region from a plurality of fourth measurement values that is a plurality of digital values including the digital values obtained from the voltage signals outputted from the different C/V conversion circuits in the second state.

9. The method of claim 6, further comprising: between said adjusting the position of the measuring device and said deriving the amount of deviation from the second measurement values,
calculating, as a plurality of third measurement values, a plurality of digital values including the digital values obtained from the voltage signals outputted from the C/V conversion circuits in the first state,
wherein in said deriving the amount of deviation from the second measurement values, any of the plurality of electrode pairs includes two adjacent sensor electrodes with a straight extension line, which connects the central position of the measuring device disposed in the region and the central position of the region, interposed therebetween based on the third measurement values.

10. The method of claim 9, further comprising: re-adjusting the position of the measuring device by using the transfer position data calibrated by using the amount of deviation derived from the second measurement values.

11. The method of claim 10, further comprising: after said re-adjusting the position of the measuring device, deriving the amount of deviation of the central position of the measuring device with respect to the central position of the region from a plurality of fourth measurement values that is a plurality of digital values including the digital values obtained from the voltage signals outputted from the different C/V conversion circuits in the second state.

* * * * *

UNITED STATES PATENT AND TRADEMARK OFFICE
CERTIFICATE OF CORRECTION

PATENT NO. : 10,948,317 B2
APPLICATION NO. : 16/294385
DATED : March 16, 2021
INVENTOR(S) : Kippei Sugita et al.

Page 1 of 1

It is certified that error appears in the above-identified patent and that said Letters Patent is hereby corrected as shown below:

In the Claims

Column 18, Line 32, Claim 3, "calculating, as plurality" should be -- calculating, as a plurality --.

Column 18, Line 49, Claim 3, "from the different" should be -- from the different C/V --.

Signed and Sealed this
Fourth Day of May, 2021

Drew Hirshfeld
*Performing the Functions and Duties of the*
*Under Secretary of Commerce for Intellectual Property and*
*Director of the United States Patent and Trademark Office*